United States Patent
Zhang et al.

(10) Patent No.: US 8,603,317 B2
(45) Date of Patent: Dec. 10, 2013

(54) HOUSING AND MANUFACTURING METHOD

(75) Inventors: Zhe-Xuan Zhang, Shenzhen (CN);
Shih-Pin Wang, New Taipei (TW); Yan Xiong, Shenzhen (CN); Che-Chao Chu, New Taipei (TW)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 23 days.

(21) Appl. No.: 13/311,746

(22) Filed: Dec. 6, 2011

(65) Prior Publication Data
US 2012/0251839 A1    Oct. 4, 2012

(30) Foreign Application Priority Data
Mar. 29, 2011  (CN) .......... 2011 1 0076628

(51) Int. Cl.
*C25D 11/20*  (2006.01)
*C25D 11/22*  (2006.01)
*C25D 5/02*   (2006.01)

(52) U.S. Cl.
USPC .......... 205/173; 205/118; 205/106; 205/120; 205/198; 205/182

(58) Field of Classification Search
USPC ......... 205/120, 106, 198, 122, 171, 172, 173, 205/174, 175, 182, 105, 121, 118; 428/632, 428/34.1
See application file for complete search history.

(56) References Cited

U.S. PATENT DOCUMENTS

| 4,445,982 | A  | * | 5/1984  | Royer ......................... 205/120 |
| 7,045,039 | B2 | * | 5/2006  | Foster et al. ............. 204/192.15 |
| 2009/0305168 | A1 | * | 12/2009 | Heley et al. .................. 430/315 |
| 2010/0159273 | A1 | * | 6/2010  | Filson et al. ................. 428/653 |

\* cited by examiner

*Primary Examiner* — Luan Van
*Assistant Examiner* — Louis Rufo
(74) *Attorney, Agent, or Firm* — Altis & Wispro Law Group, Inc.

(57) ABSTRACT

A housing having a coating is disclosed. The housing comprises a base substrate made of metallic material; a micro-arc oxide layer formed on the base substrate; and a protection outer film formed on the micro-arc oxide layer and comprising a coating layer and a metallic layer, wherein the metallic layer is formed on the micro-arc oxide layer and covers a portion of the micro-arc oxide layer; and the coating layer is formed on a remaining portion of the micro-arc oxide layer so that the micro-arc oxide layer is covered by the metallic layer and the coating layer.

11 Claims, 4 Drawing Sheets

HOUSING AND MANUFACTURING METHOD

BACKGROUND

1. Technical Field

The present disclosure generally relates to housings, and particularly to a housing having a coating and a method for manufacturing the housing.

2. Description of Related Art

To make the electronic devices more fashionably and aesthetically appealing to users, housings of portable electronic devices may be decorated or coated to form a decorative layer on the corresponding outer surfaces. In addition, a logo may be often formed on the housing of the electronic device to distinguish it from other electronic devices. The logo may be often made of metallic materials and be adhered to the decorative layer of the housing directly. However, the logo may be easily peeled off from the housing, after the electronic device has been used for a long time.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views, and all the views are schematic.

DETAILED DESCRIPTION

Figure 1:
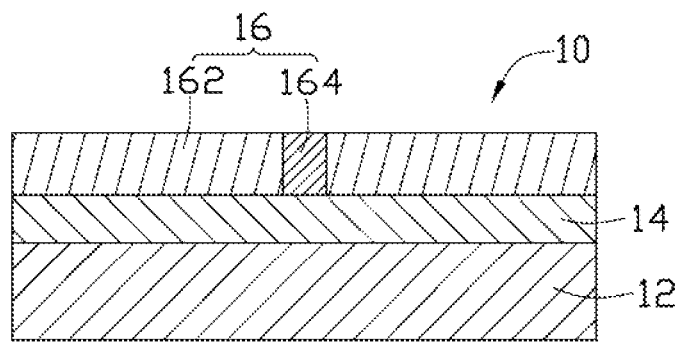
FIG. 1 shows a cross-sectional view of a housing according to a first embodiment of the present disclosure.

Referring to FIG. 1, a first embodiment of a housing 10 comprises a base substrate 12 made of metallic materials, a micro-arc oxide layer 14 formed on the base substrate 12, and a protection outer film 16 formed on the micro-arc oxide layer 14. The protection outer film 16 comprises a coating layer 162 and a metallic layer 164. The metallic layer 164 is formed on the micro-arc oxide layer 14 and covers a portion of the micro-arc oxide layer 14. The coating layer 162 is formed on a remaining portion of the micro-arc oxide layer 14. The coating layer 162 and the metallic layer 164 cover the micro-arc oxide layer 14.

In the illustrated embodiment, the metallic layer 164 is formed on a substantially central portion of the micro-arc oxide layer 14. The coating layer 162 is formed on a remaining portion of the micro-arc oxide layer 14 and surrounds the metallic layer 164. The base substrate 12 is made of magnesium alloy. A thickness of the coating layer 162 is in a range from about 5 μm to about 10 μm. A thickness of the metallic layer 164 is in a range from about 1 μm to about 40 μm. The metallic layer 164 may be designed as a decorative pattern or a logo icon.

The base substrate 12 may be made of metallic materials such as magnesium, aluminum, titanium, for example, or alloys such as aluminum alloy, magnesium alloy, titanium alloy, or any other suitable alloys. The coating layer 162 may be a paint layer, a printed ink layer, or a vacuum coating formed on the micro-arc oxide layer 14. The coating layer 162 may comprise one, two, or more than two layers.

Figure 2:
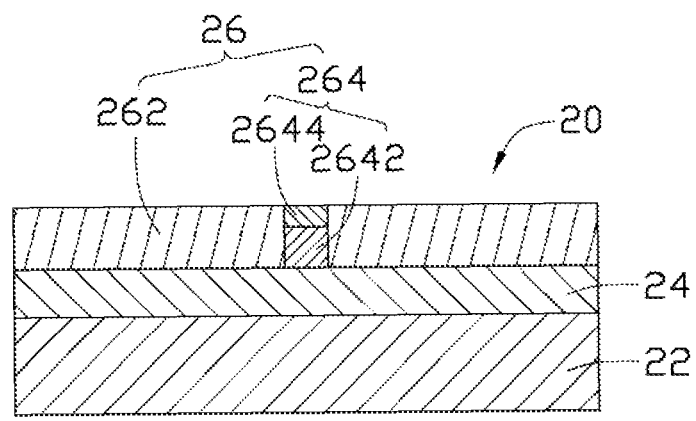
FIG. 2 shows a cross-sectional view of a housing according to a second embodiment of the present disclosure.

Referring to FIG. 2, a second embodiment of a housing 20 is shown. The housing 20 has a shape and a structure similar to that of the housing 10 of the first embodiment. The housing 20 comprises a metallic base substrate 22, a micro-arc oxide layer 24 formed on the base substrate 22, and a protection outer film 26 formed on the micro-arc oxide layer 24. The protection outer film 26 comprises a coating layer 262 and a metallic layer 264. The difference between the housing 20 and the housing 10 is that, in housing 20, the metallic layer 264 is a two-layered structure. The metallic layer comprises a first metallic layer 2642, and a second metallic layer 2644 formed on the first metallic layer 2642. The first metallic layer 2642 is made of copper and has a thickness in a range from about 1 μm to about 40 μm. The second metallic layer 2644 is made of chromium and has a thickness in a range from about 0.1 μm to about 30 μm.

The second metallic layer 2644 may also be made of gold, nickel, tin, cobalt, silver, platinum, rhodium, palladium or other metallic material. The metallic layer 264 may also be a multi-layered structure.

Figure 3:
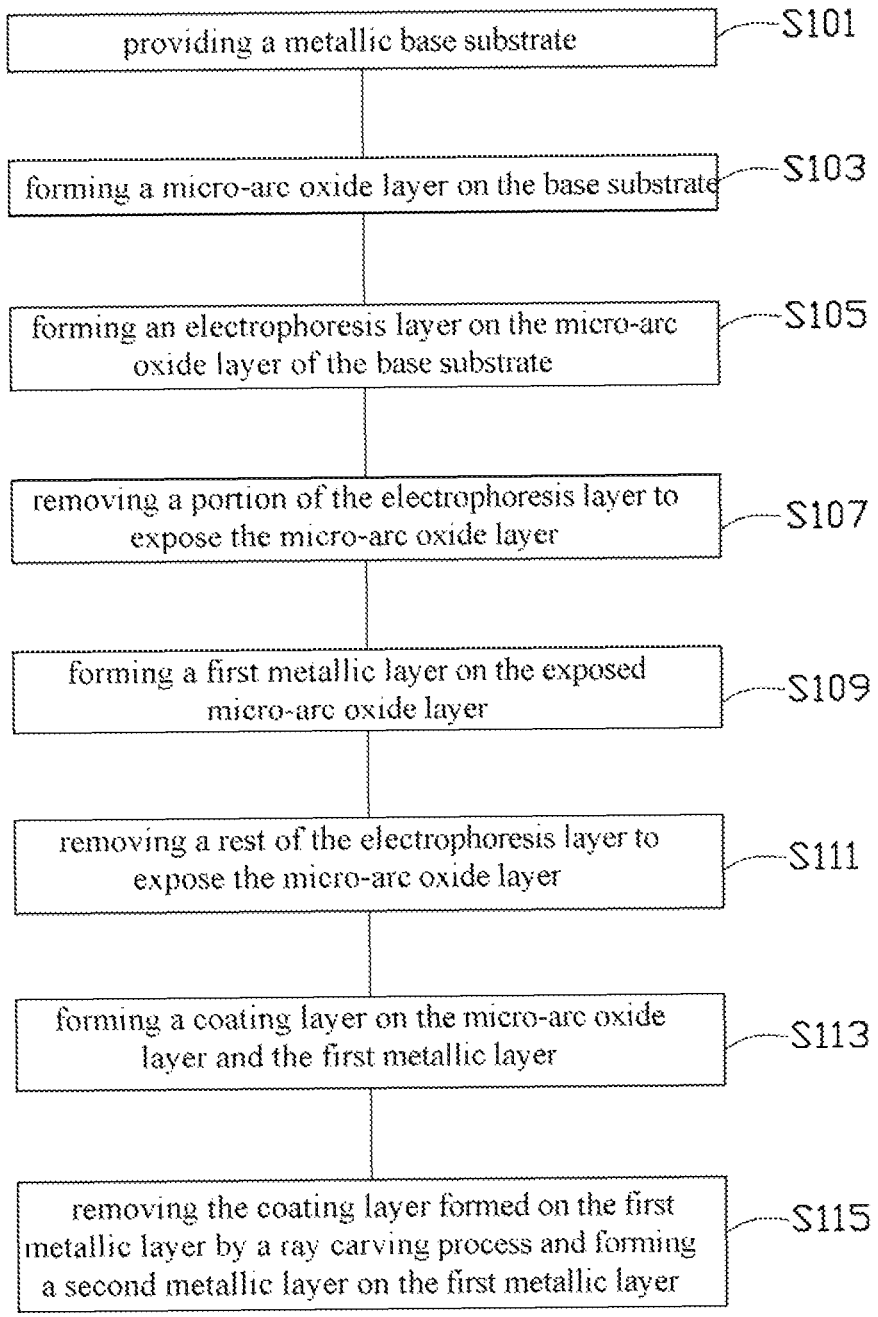
FIG. 3 is a flowchart of manufacturing processes of the housing in FIG. 2.

Also referring to FIG. 3, an exemplary method for making the housing 20 comprises the following steps S101 to S115:

In step S101, a metallic base substrate 22 is provided. In the illustrated embodiment, the base substrate 22 is made of magnesium alloy. The base substrate 22 has a length about 50 mm, a width about 30 mm and a thickness about 1 mm. The base substrate 22 may go through a cleaning process prior to Step S101 to keep the base substrate 22 clean. During the cleaning process, the base substrate 22 may be first cleaned by means of an ultrasonic cleaning process, a pickling process, an alkaline cleaning process, or a washing process, and then dried in a drying process.

In step S103, the base substrate 22 is oxidized to form a micro-arc oxide layer 24 by electrolysis. In the illustrated embodiment, the micro-arc oxide layer 24 is a porous metal oxide ceramic film. The oxidation process is taken under a positive voltage in a range from about 300 to about 550 volts, a current density in a range from about 1 to about 9 amperes per square decimeter, and an oxidation time for about 3 to about 30 minutes, thereby forming the micro-arc oxide layer 24 on a surface of the base substrate 22. A thickness of the micro-arc oxide layer 24 is in a range from about 1 μm to about 200 μm.

In step S105, an electrophoresis layer 25 (see FIG. 4) is formed on the micro-arc oxide layer 24 of the base substrate 22 by an electrophoresis coating process. In order to improve the conductivity of the micro-arc oxide layer 24 of the base substrate 22, the oxidized base substrate 22 may be electroplated, sputtered, or sprayed with conductive paint prior to the step S105. In the illustrated embodiment, the base substrate 22 is immersed into an electrophoresis tank for receiving an electrophoresis coating, under a positive voltage in a range from about 25 to about 100 volts, and an electrophoresis time for about 30 to about 180 seconds, thereby forming the electrophoresis layer 25. A thickness of the electrophoresis layer 25 is in a range from about 0.5 μm to about 15 μm. An electrophoresis paint used in S105 may be selected from epoxy ester anode electrophoresis paint, a pure melt bond anode electrophoresis paint, a polybutadiene anode electrophoresis paint, a maleic anhydride oil anodic electrophoresis paint.

Figure 4:
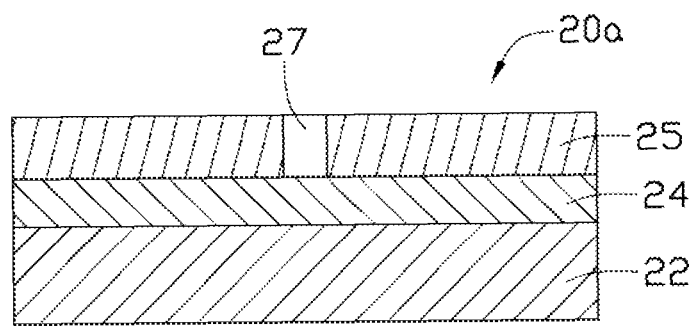
FIG. 4 shows a cross-sectional view of a preformed housing obtained during the manufacturing processes.

In step S107, a portion of the electrophoresis layer 25 is removed, thereby forming a concavity 27 recessed from the electrophoresis layer 25 toward the micro-arc oxide layer 24, to form a preformed housing 20a (see FIG. 4). In the illustrated embodiment, the concavity 27 is formed by a ray carving process. The concavity 27 has a width about 3 mm and a length about 6 mm. A bottom of the concavity 27 is the micro-arc oxide layer 24.

In step S109, a first metallic layer 2642 is formed on the bottom micro-arc oxide layer 24 and positioned within the concavity 27 of the preformed housing 20a. In the illustrated embodiment, the first metallic layer 2642 is made of copper material. A thickness of the first metallic layer 2642 is in a range from about 1 μm to about 40 μm. The first metallic layer 2642 may be formed on the micro-arc oxide layer 24 by the following sub-steps. First, alkalizing the preformed housing 20a by being immersed the preformed housing 20a into an alkaline liquid tank under room temperature for about 3-10 minutes. In one embodiment, the alkaline liquid is mixed with sodium tetrachloropalladate(II), 2-morpholinyl ethane sulfonic acid and sodium chloride, which, the density of the Sodium tetrachloropalladate(II) is about 0.05-0.3 g/L. Second, immersing the alkalized, preformed housing 20a into a sodium hydroxide solution with a density about 5-15 g/L for about 0.5-2 minutes. Third, immersing the preformed housing 20a a liquid mixture mixed by copper sulfate, sodium potassium tartrate, sodium hydroxide, sodium carbonate, formaldehyde and thiocarbamide, for about 3-10 minutes. In the illustrated embodiment, the density of the copper sulfate is 3.5-10 g/L, the density of the sodium potassium tartrate is about 30-50 g/L, the density of the sodium hydroxide is about 7-10 g/L, the density of the sodium carbonate is about 0-3 g/L, the density of the formaldehyde is about 10-15 ml/L, and the density of the thiocarbamide is about 7-10 g/L. Finally, electroplating a copper layer on the exposed micro-arc oxide layer 24 of the preformed housing 20a. In the illustrated embodiment, the electroplating process of the copper layer is taken place under a temperature of about 50-60° C., and a current density in a range from about 0.5 to about 10 amperes per square decimeter. During the electroplating process, the preformed housing 20a is put into an electroplating tank filled with plating solution mixed by copper pyrophosphate and potassium pyrophosphate, and thereby forming the copper layer (namely the first metallic layer 2642) on the micro-arc oxide layer 24 of the preformed housing 20a. A density of the copper pyrophosphate is about 70-100 g/L, and a density of the potassium pyrophosphate is about 300-400 g/L. A thickness of the copper layer is in a range from about 1 μm to about 40 μm.

In step S111, a rest of the electrophoresis layer 25 of the preformed housing 20a is removed to expose the bottom micro-arc oxide layer 24. In the illustrated embodiment, the rest of the electrophoresis layer 25 is removed by an electrophoresis paint remover.

In step S113, a coating layer 262 is formed on the micro-arc oxide layer 24 and the first metallic layer 2642 of the preformed housing 20a. In the illustrated embodiment, a thickness of the coating layer 262 is in a range from about 5 μm to about 10 μm.

In step S115: the coating layer 262 formed on the first metallic layer 2642 of the preformed housing 20a is removed by a ray carving process and a second metallic layer 2644 is formed by electroplating process to cover the first metallic layer 2642. In the illustrated embodiment, the second metallic layer 2644 is a decorative pattern or a logo icon. A thickness of the second metallic layer 2644 is in a range from about 0.1 μm to about 30 μm. The second metallic layer 2644 is made of gold, nickel, tin, cobalt, silver, platinum, rhodium, palladium or other metallic material.

Since the protection outer film 16 of the housing 10 includes a coating layer 162 and a metallic layer 164, the metallic layer 164 is firmly formed on a portion of the micro-arc oxide layer 14 by electroplating process, thereby preventing the metallic layer 164 from peeling or falling off the housing 10.

Finally, while various embodiments have been described and illustrated, the disclosure is not to be construed as being limited thereto. Various modifications can be made to the embodiments by those skilled in the art without departing from the true spirit and scope of the disclosure as defined by the appended claims.

What is claimed is:

1. A housing manufacturing method, the method comprising:
   providing a metallic base substrate;
   forming a micro-arc oxide layer on the base substrate;
   forming an electrophoresis layer on the micro-arc oxide layer of the base substrate;
   removing a portion of the electrophoresis layer to expose the micro-arc oxide layer;
   forming a first metallic layer on the exposed micro-arc oxide layer;
   removing a remaining portion of the electrophoresis layer to expose the micro-arc oxide layer;
   forming a coating layer on the micro-arc oxide layer and the first metallic layer; and
   removing the coating layer formed on the first metallic layer and forming a second metallic layer on the first metallic layer.

2. The housing manufacturing method of claim 1, removing of the coating layer comprises a ray carving process.

3. The housing manufacturing method of claim 1 further comprises cleaning the base substrate before forming a micro-arc oxide layer on the base substrate.

4. The housing manufacturing method of claim 3, cleaning of the base substrate comprises pre-cleaning the base substrate, and drying the substrate; wherein the pre-cleaning comprises an ultrasonic cleaning process, a pickling process, an alkaline cleaning process, or a washing process.

5. The housing manufacturing method of claim 1, the forming a micro-arc oxide layer comprises an oxidation process to form a porous metal oxide ceramic film.

6. The housing manufacturing method of claim 5, wherein the oxidation process is taken under a positive voltage in a range from about 300 to about 550 volts, a current density in a range from about 1 to about 9 amperes per square decimeter, and an oxidation time for about 3 to about 30 minutes.

7. The housing manufacturing method of claim 6, wherein the thickness of the micro-arc oxide layer is in a range from about 1 μm to about 200 μm.

8. The housing manufacturing method of claim 6, wherein the first metallic layer is made of copper material, and a thickness of the first metallic layer is in a range from about 1 μm to about 40 μm.

9. The housing manufacturing method of claim 8, the forming the first metallic layer on the micro-arc oxide layer comprising:
   immersing the base substrate into an alkaline liquid about 3-10 minutes under room temperature;
   immersing the base substrate into a sodium hydroxide solution with a density about 5-15 g/L for about 0.5-2 minutes;
   immersing the base substrate into a liquid mixture of copper sulfate, sodium potassium tartrate, sodium hydroxide, sodium carbonate, formaldehyde, and thiocarbamide for about 3-10 minutes;
   electroplating a copper layer on the exposed micro-arc oxide layer of the base substrate.

10. The housing manufacturing method of claim 9, wherein the alkaline liquid is mixed with Sodium tetrachloropalladate (II), 2-morpholinyl ethane sulfonic acid, and sodium chloride; the density of the Sodium tetrachloropalladate (II) is about 0.05-0.3 g/L.

11. The housing manufacturing method of claim 10, wherein the electroplating of a copper layer is under a temperature of about 50-60° C., and a current density in a range from about 0.5 to about 10 amperes per square decimeter; a plating solution applied to the copper plating process is mixed by copper pyrophosphate and potassium pyrophosphate, a density of the copper pyrophosphate is about 70-100 g/L, and a density of the potassium pyrophosphate is about 300-400 g/L.

* * * * *